(12) United States Patent
Hsieh

(10) Patent No.: US 9,530,882 B1
(45) Date of Patent: Dec. 27, 2016

(54) TRENCH MOSFET WITH SHIELDED GATE AND DIFFUSED DRIFT REGION

(71) Applicant: Force Mos Technology Co., Ltd., New Taipei (TW)

(72) Inventor: Fu-Yuan Hsieh, New Taipei (TW)

(73) Assignee: FORCE MOS TECHNOLOGY CO., LTD (TW)

( * ) Notice: Subject to any disclaimer, the term of this patent is extended or adjusted under 35 U.S.C. 154(b) by 0 days.

(21) Appl. No.: 14/943,109

(22) Filed: Nov. 17, 2015

(51) Int. Cl.
| | | |
|---|---|---|
| H01L 29/78 | (2006.01) | |
| H01L 29/10 | (2006.01) | |
| H01L 29/06 | (2006.01) | |
| H01L 29/423 | (2006.01) | |
| H01L 23/535 | (2006.01) | |
| H01L 23/532 | (2006.01) | |
| H01L 29/66 | (2006.01) | |
| H01L 21/768 | (2006.01) | |
| H01L 29/40 | (2006.01) | |

(52) U.S. Cl.
CPC ..... *H01L 29/7813* (2013.01); *H01L 21/76805* (2013.01); *H01L 21/76843* (2013.01); *H01L 21/76895* (2013.01); *H01L 23/535* (2013.01); *H01L 23/53266* (2013.01); *H01L 29/0623* (2013.01); *H01L 29/0696* (2013.01); *H01L 29/1095* (2013.01); *H01L 29/401* (2013.01); *H01L 29/404* (2013.01); *H01L 29/407* (2013.01); *H01L 29/4236* (2013.01); *H01L 29/66734* (2013.01); *H01L 29/7811* (2013.01)

(58) Field of Classification Search
CPC ............. H01L 29/407; H01L 29/42368; H01L 29/66727; H01L 29/66734; H01L 29/7811; H01L 29/7813; H01L 29/42376; H01L 29/7828; H01L 29/41766; H01L 29/7839

See application file for complete search history.

(56) References Cited

U.S. PATENT DOCUMENTS

| | | | | |
|---|---|---|---|---|
| 2010/0140689 | A1* | 6/2010 | Yedinak | H01L 29/0692 257/330 |
| 2013/0168760 | A1* | 7/2013 | Hsieh | H01L 29/407 257/330 |

* cited by examiner

*Primary Examiner* — Ermias Woldegeorgis
(74) *Attorney, Agent, or Firm* — Bacon & Thomas, PLLC

(57) ABSTRACT

A trench MOSFET with diffused drift region and closed cell layout having shielded gate is disclosed, wherein closed gate trenches surrounding a deep trench in each unit cell and the shielded gate disposed in the deep trench. Trenched source-body contacts are formed between the closed gate trenches and the deep trench. The deep trench has square, rectangular, circle or hexagon shape.

17 Claims, 19 Drawing Sheets

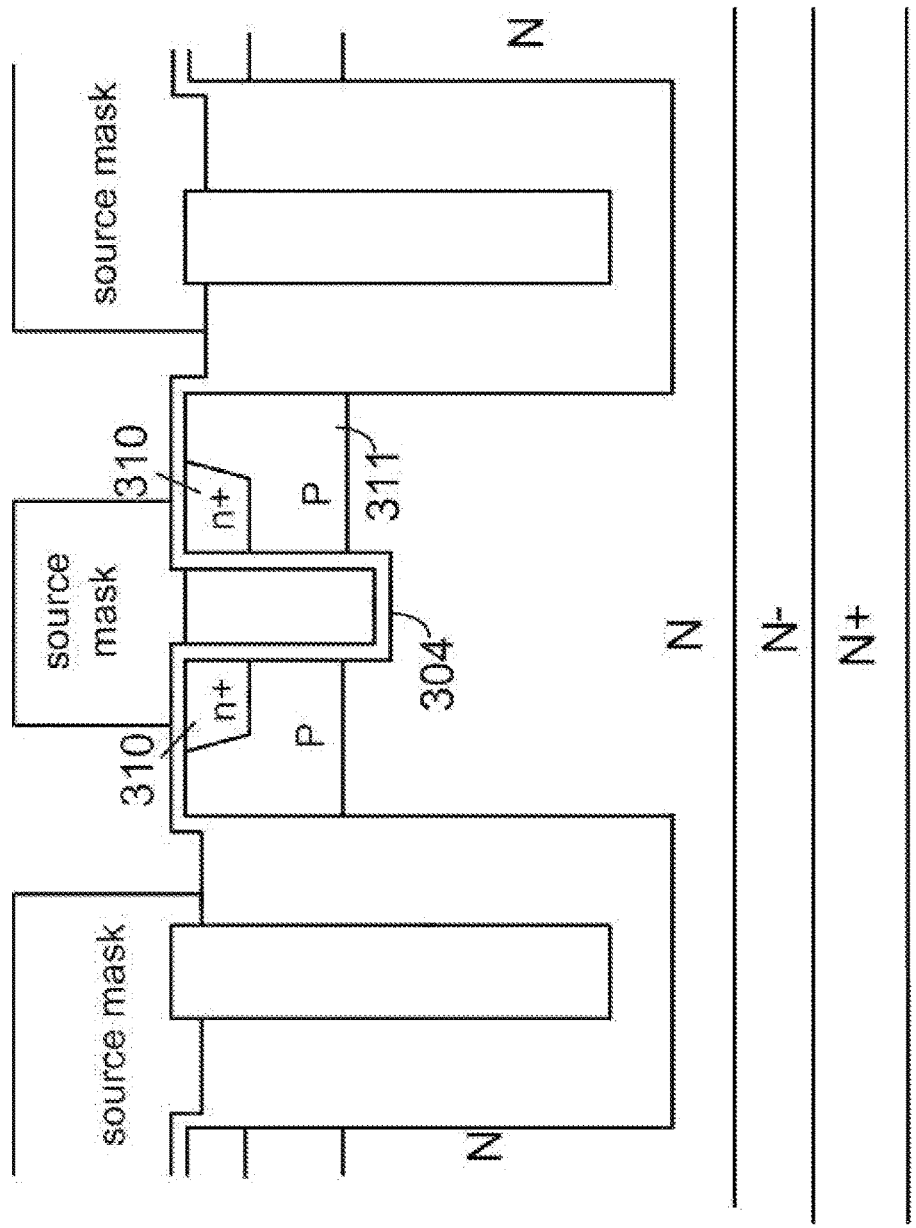

TRENCH MOSFET WITH SHIELDED GATE AND DIFFUSED DRIFT REGION

FIELD OF THE INVENTION

This invention relates generally to the cell structure, device configuration and fabrication process of semiconductor power device. More particularly, this invention relates to a novel and improved cell structure, device configuration and improved fabrication process of a trench MOSFET (Metal Oxide Semiconductor Field Effect Transistor)

BACKGROUND OF THE INVENTION

Please refer to FIG. 1A for an N-channel trench MOSFET 100 disclosed in a prior art of U.S. Pat. No. 8,587,054 having an N diffused drift region 101, wherein said N-channel trench MOSFET 100 is formed in an N-epitaxial layer 102 onto an N+ substrate 103. In FIG. 1A, a pair of deep trenches 104 are formed with each filled with: a pair of gate electrodes 105 and a shielded source electrode 106. In the mesa area between said pair of deep trenches 104, a P body region 107 and an N+ source region 108 is connected to a source metal through a trenched source-body contact region 109. FIG. 1B shows another cross-sectional view of the trench MOSFET 100 in FIG. 1A, the doping profile along A-B cross section is shown in FIG. 1C, which shows that, the N diffused drift region 101 has a higher doping concentration near the trench sidewalls of the deep trenches 104 than in center of the mesa area, which is easier to realize and control in process flow.

However, to fabricate the deep trenches 104 in FIG. 1A, it is hard to control the formation of the gate electrodes 105 and the shielded source electrode 106, especially in a small die size.

Therefore, there is still a need in the art of the semiconductor power device, particularly for trench MOSFET design and fabrication, to provide a novel cell structure, device configuration and fabrication process that would resolve these difficulties.

SUMMARY OF THE INVENTION

The present invention provides a trench MOSFET with shielded gate and diffused drift region, which comprises at least one gate trench surrounding a deep trench wherein a shielded gate being formed inside the deep trench, and further comprises a trenched source-body contact disposed between the gate trench and the deep trench.

In one aspect, the present invention features a trench MOSFET having shielded gate and diffused drift region, comprising: a substrate of a first conductivity type; an epitaxial layer of the first conductivity type onto the substrate, wherein the epitaxial layer has a lower doping concentration than the substrate; the deep trench having a greater trench depth than the gate trench; the shielded gate being formed within the deep trench and surrounded with a dielectric material; a mesa area between a pair of adjacent deep trenches; a diffused drift region of the first conductivity type formed in the mesa area and having a higher doping concentration than the epitaxial layer, wherein the diffused drift region has a higher doping concentration near trench sidewalls of the deep trench than in the center of the mesa area; a source region of the first conductivity type extending between the deep trenches and surrounding sidewalls of the gate trench above a body region of a second conductivity type; the gate trench filled with gate electrode padded by a gate insulation layer, starting from top surface of the epitaxial layer and down penetrating through the source region, the body region and extending into the diffused drift region in the mesa area, wherein the gate insulation layer has a thickness thinner than the dielectric material; and a source metal connected with the shielded gate through a shielded gate contact and connected with the source region through the trenched source-body contact.

According to another aspect of the present invention, in some preferred embodiments, the trench MOSFET further comprises a body contact region of the second conductivity type formed within the body region and surrounding at least bottom of the trenched source-body contact, wherein the body contact region has a higher doping concentration than the body region.

According to another aspect of the present invention, in some preferred embodiments, the trenched source-body contact and the shielded gate contact are each filled with a contact metal plug comprising a tungsten plug padded by a barrier layer of Ti/TiN or Co/TiN or Ta/TiN.

According to another aspect of the present invention, a trench MOSFET with closed cell layout is disclosed, wherein at least closed gate trench is surrounding a deep trench as a unit closed cell. In some preferred embodiment, the closed gate trench has a square closed shape. In another preferred embodiment, the closed gate trench has a rectangular closed shape and all the unit cells are arranged in single orientations. In another preferred embodiment, the closed gate trench has a rectangular closed shape and all the unit cells are arranged in multiple orientations. In another preferred embodiment, the closed trench gate can also has circle or hexagon shape.

According to another aspect of the present invention, a trench MOSFET with stripe cell layout is disclosed.

According to another aspect of the present invention, the trench MOSFET further comprises a termination area which comprises a guard ring under a metal field plate and connected with the source region, and multiple floating guard rings having floating voltage, wherein the guard ring and the multiple floating guard rings all have the second conductivity type and have junction depths greater than the body region.

According to another aspect of the present invention, the trench MOSFET further comprises a termination area which comprises multiple floating rings of the second conductivity type, wherein the multiple floating rings of said second conductivity type have floating voltage and have junction depths same as the body region.

The invention also features a method for manufacturing a trench MOSFET comprising the steps of: (a) growing an epitaxial layer of a first conductivity type upon a substrate of the first conductivity type, wherein the epitaxial layer having a lower doping concentration than the substrate; (b) forming a deep trench mask such as an oxide onto a top surface of the epitaxial layer for definition of a plurality of deep trenches; (c) forming the gate trenches, and a mesa between two adjacent gate trenches in the epitaxial layer by etching through open regions in the deep trench mask; (d) growing a screen oxide along inner surface of the gate trenches; (e) carrying out an angle Ion Implantation of the first conductivity type dopant into the mesas through trench sidewalls of the deep trenches followed by a diffusion step to form a diffused drift region in the mesa; (f) removing the hard mask before or after formation of the diffused drift regions; (g) forming a dielectric material along inner surfaces of the gate trenches by thermal oxide growth or oxide deposition; (h) depositing a first doped poly-silicon layer filling the deep trenches to serve as shielded gate; (i) etching back the first doped poly-silicon and the padded oxide layer from unnecessary portion; (j) etching a gate trench in the mesa between two adjacent deep trenches by applying a trench mask; (k) forming a thin oxide layer to serve as a gate insulation layer covering a top surface of the epitaxial layer, along inner surface of the gate trench; (l) depositing a second doped poly-silicon layer filling the gate trench to serve as a gate electrode; (m) etching back the second doped poly-silicon layer by CMP (Chemical Mechanical Polishing) or plasma etch; (n) carrying out a body implantation of the second conductivity type dopant and a step of body diffusion to form body regions; (o) applying a source mask onto the top surface of the epitaxial layer, and carrying out a source implantation of the first conductivity type dopant and a source diffusion to form source regions; (p) forming a contact insulating interlayer covering top surface of the epitaxial layer; and (q) etching openings and filling contact metal plug in those openings to form shielded gate contacts and trenched source-body contacts.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 11A-11G are a serial of side cross-sectional views for showing the processing steps for fabricating the trench MOSFET of FIG. 3.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
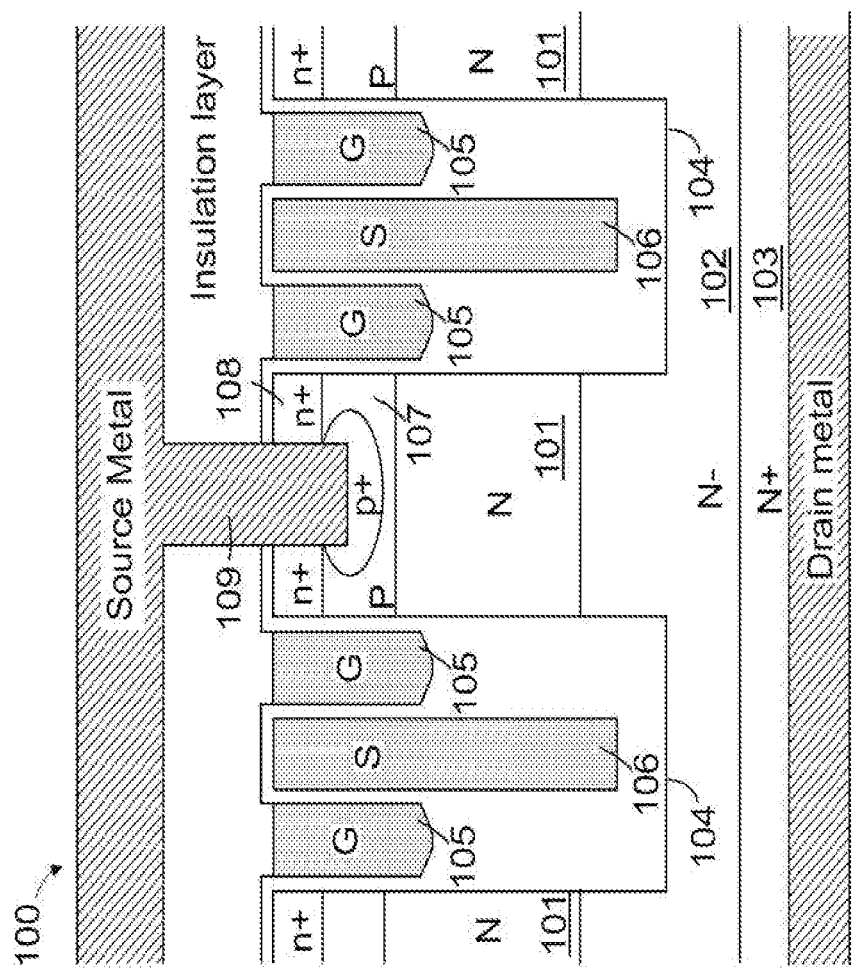
FIG. 1A is a cross-sectional view of a trench MOSFET of a prior art.
Figure 1B:
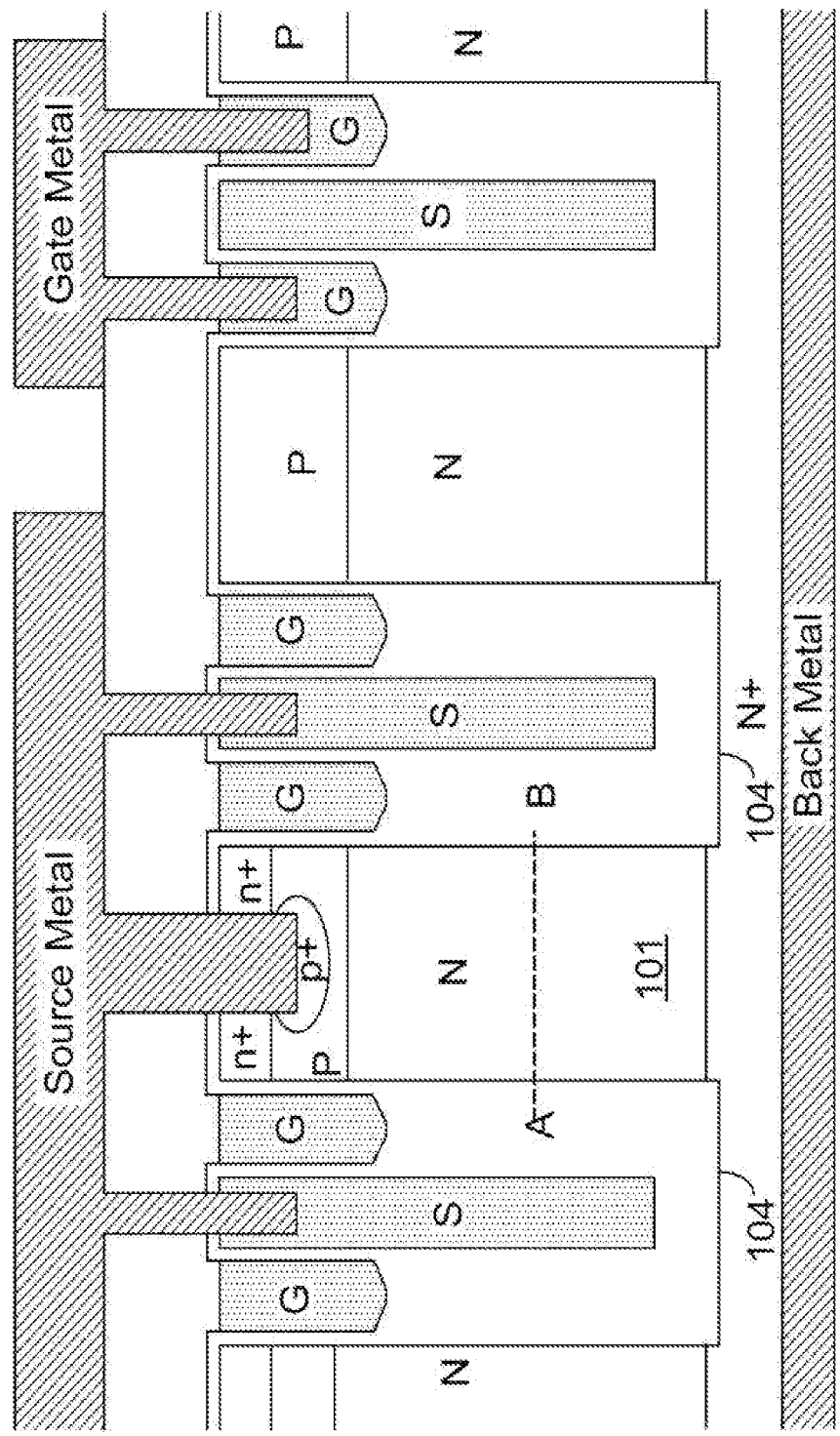
FIG. 1B is a cross-sectional view for showing another cross-section view of the prior art.
Figure 1C:
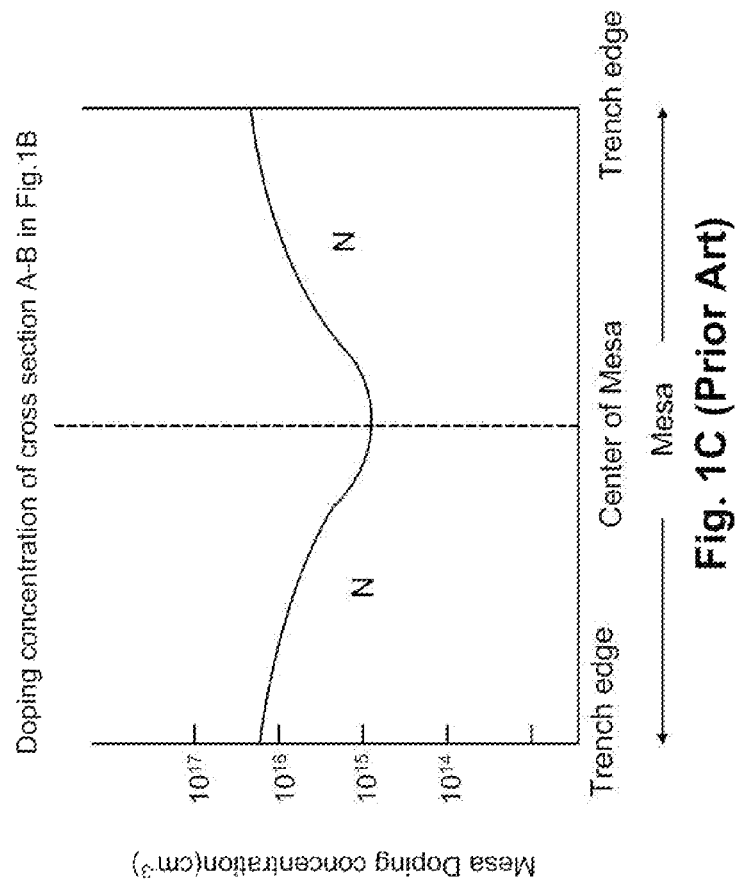
FIG. 1C is a plot showing doping profile along A-B in FIG. 1B.

Please refer to FIG. 1 for a preferred embodiment of this invention wherein an N-channel trench MOSFET 200 is formed in an N-epitaxial layer 201 onto an N+ substrate 202 coated with a back metal 203 on rear side as a drain metal, wherein said back metal 203 can be implemented by using Ti/Ni/Ag. At least one gate trench 204 is formed surrounding a deep trench 205 as a closed cell shape in an active area, wherein said deep trench 205 is starting from a top surface of said N-epitaxial layer 201 and extending downward into said N-epitaxial layer 201 in an active area, wherein trench bottom of said deep trench 205 is above a common interface between said N+ substrate 202 and said N-epitaxial layer 201. Each of said deep trench 205 is filled with a shielded gate 206 padded by a dielectric material 207, wherein said shielded gate 206 is connected to a source metal 208 through a shielded gate contact 209. In the mesa area between a pair of said deep trench 205, at least one gate trench 204 is formed surrounded by n+ source regions 210 above a P body region 211, wherein said gate trench 204 is filled with a gate electrode 212 padded by a gate insulation layer 213, and is extending into a N diffused drift region 214 underneath said P body region 211 in the mesa area, wherein said gate insulation layer 213 has a thickness thinner than said dielectric material 207 and said N diffused drift region 214 has a higher doping concentration near trench sidewalls of said deep trenches 205 than in the center of the mesa. Said n+ source regions 210 and said P body region 211 is connected to said source metal 208 through a plurality of trenched source-body contacts 215, besides, a p+ body contact region 216 is formed to reduce the contact resistance between said P body region 211 and said trenched source-body contact 215. Said shielded gate contact 209 and said trenched source 215 are all formed penetrating through a contact insulation interlayer 217 covering top surface of said N-epitaxial layer 201.

Figure 2:
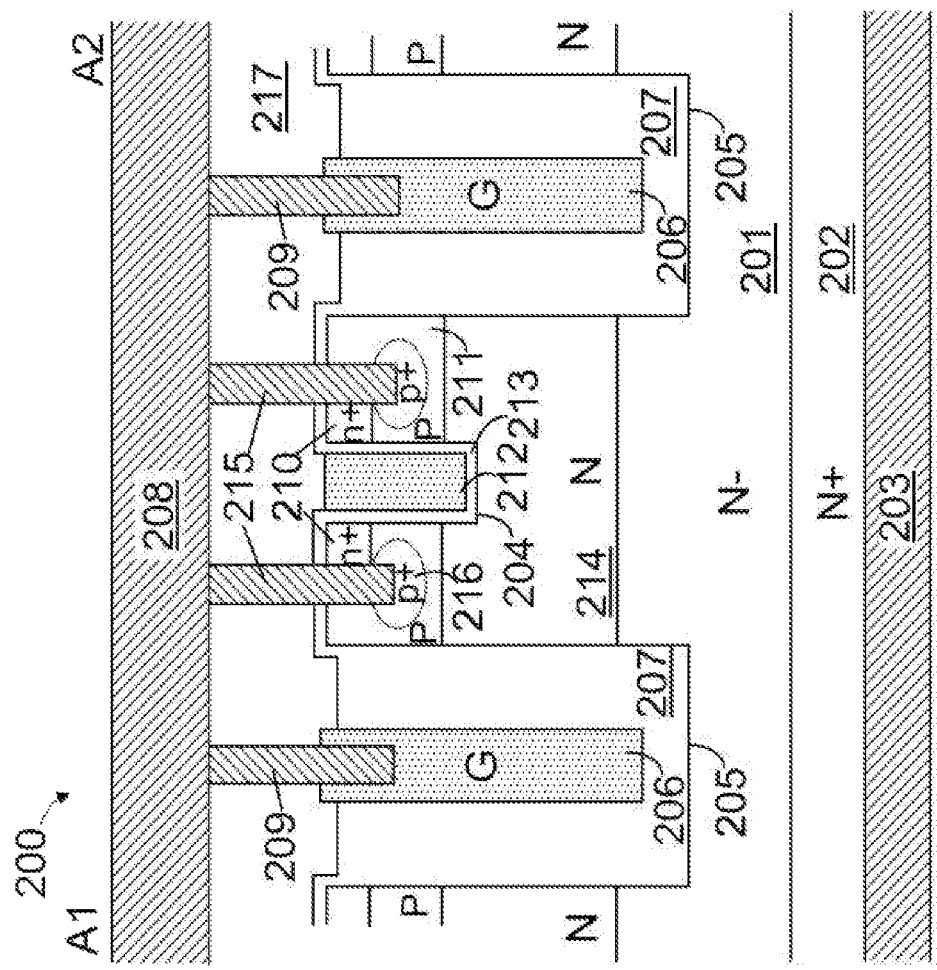
FIG. 2 is a cross-sectional view of a preferred embodiment according to the present invention.
Figure 3:
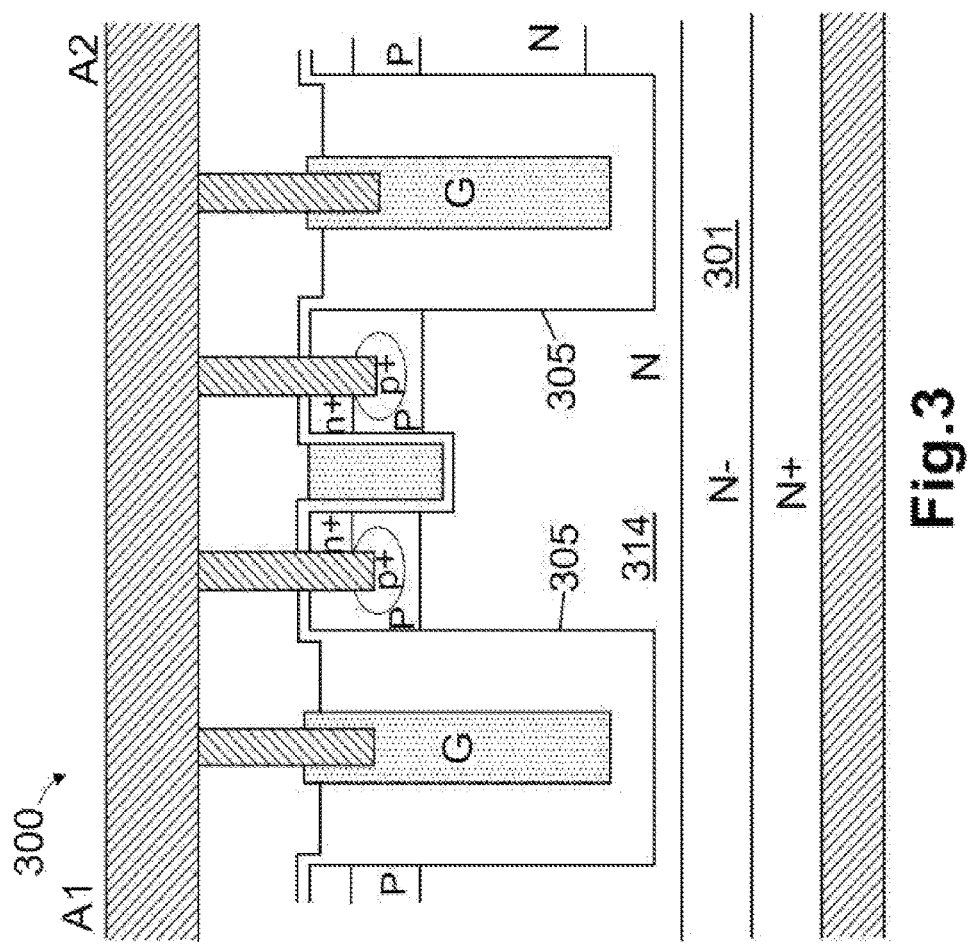
FIG. 3 is a cross-sectional view of another preferred embodiment according to the present invention.

FIG. 3 is a cross-sectional view of another preferred embodiment according to the present invention for showing an N-channel trench MOSFET 300 which is similar to the trench MOSFET 200 in FIG. 2 except that, in FIG. 3, the trench bottom of the deep trench 305 is above the common interface between the N diffused drift region 314 and the N-epitaxial layer 301.

Figure 4:
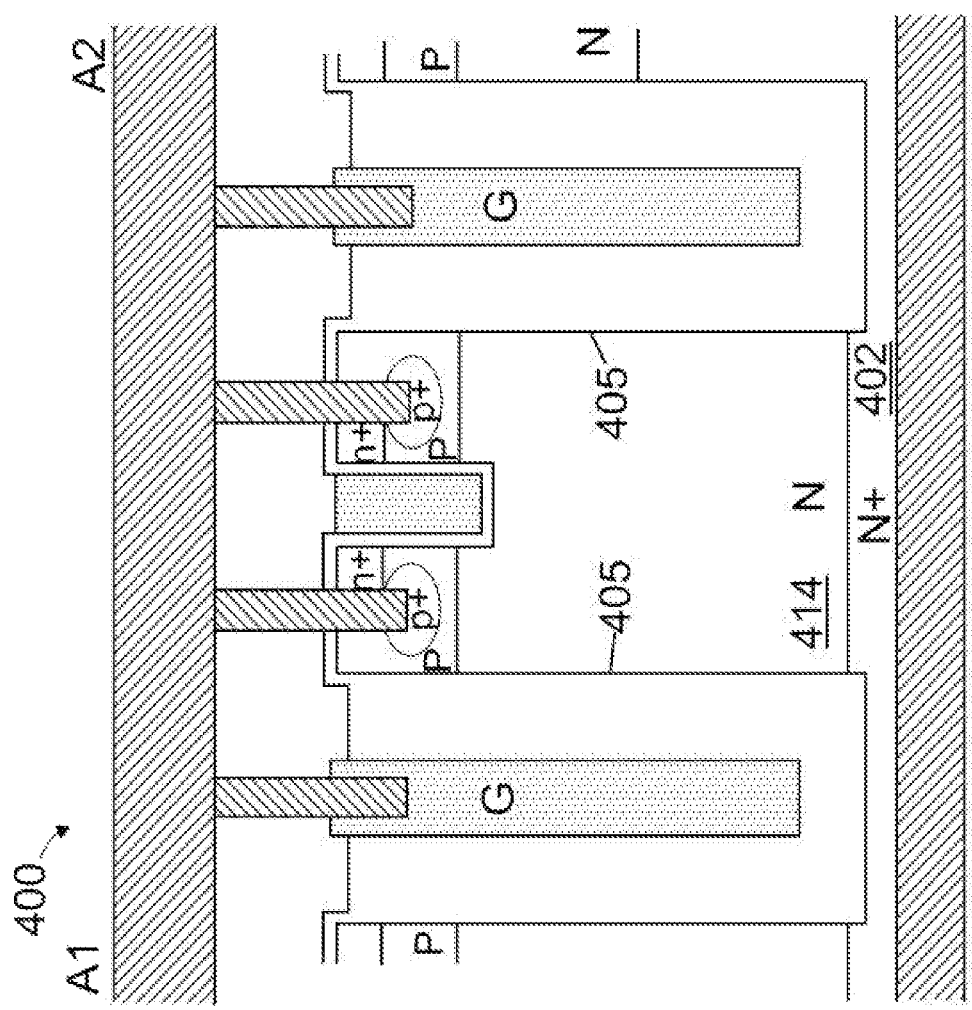
FIG. 4 is a cross-sectional view of another preferred embodiment according to the present invention.

FIG. 4 is a cross-sectional view of another preferred embodiment according to the present invention for showing an N-channel trench MOSFET 400 which is similar to the trench MOSFET 200 in FIG. 2 except that, in FIG. 4, the N diffused drift region 414 is connecting with the N+ substrate 402, and trench bottom of the deep trench 405 is extending into the N+ substrate 402.

Figure 5:
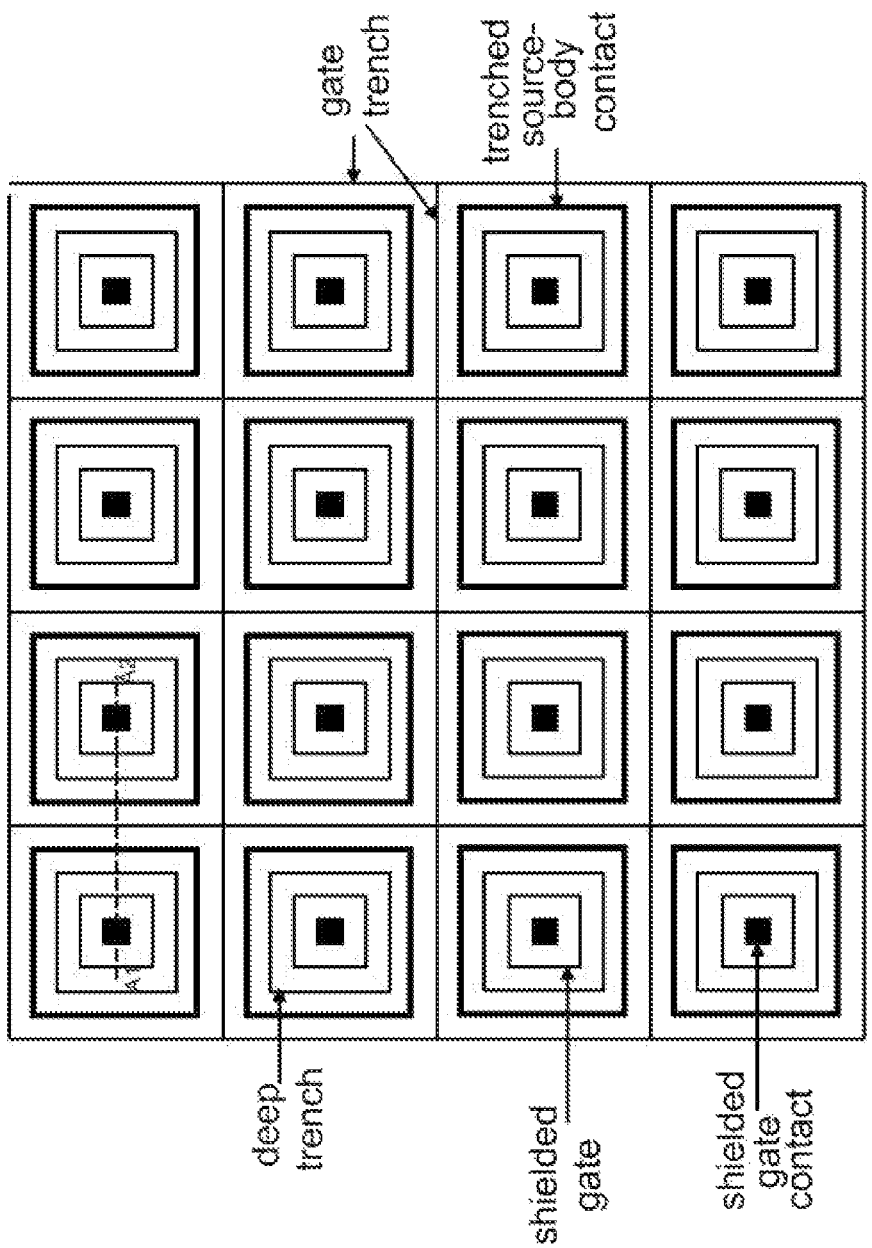
FIG. 5 is a top view of another preferred embodiment according to the present invention.
Figure 6:
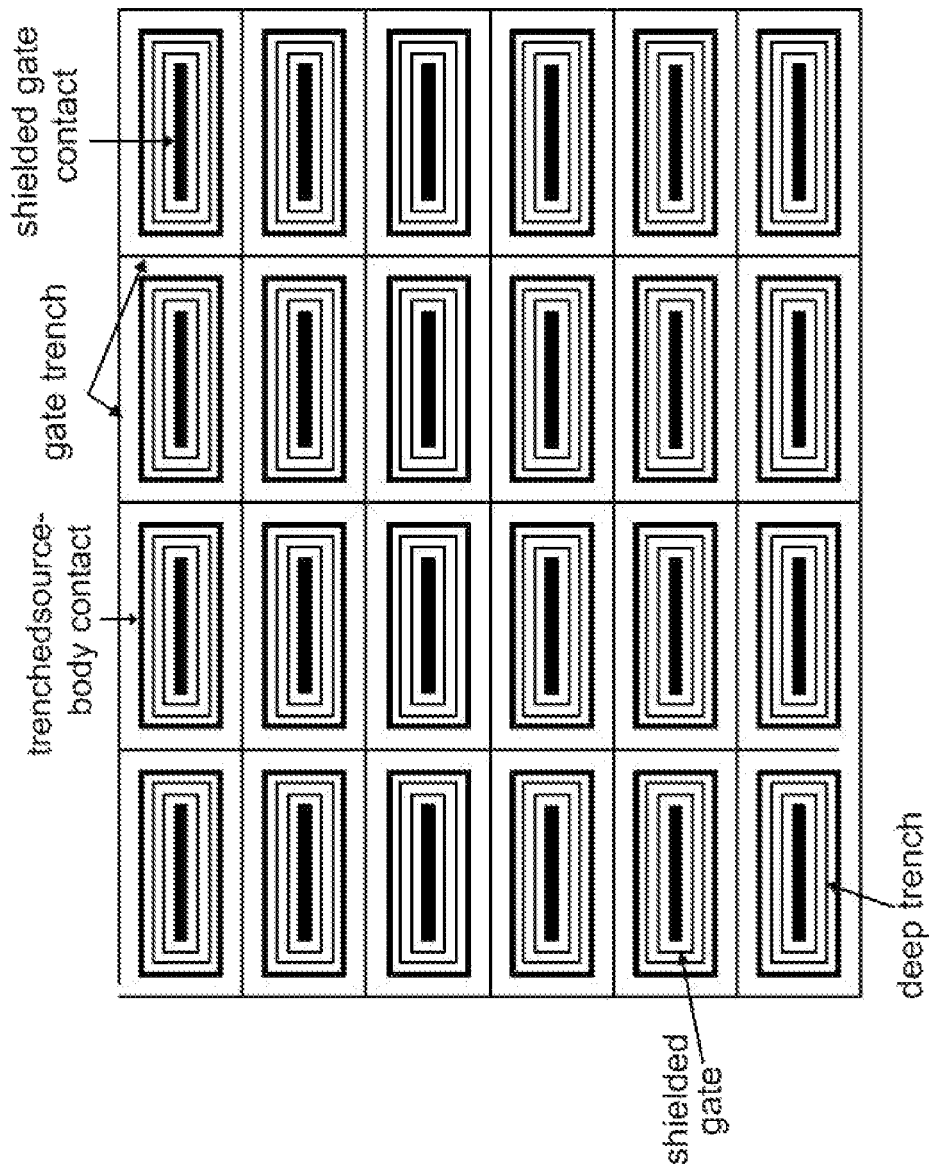
FIG. 6 is a top view of another preferred embodiment according to the present invention.
Figure 7:
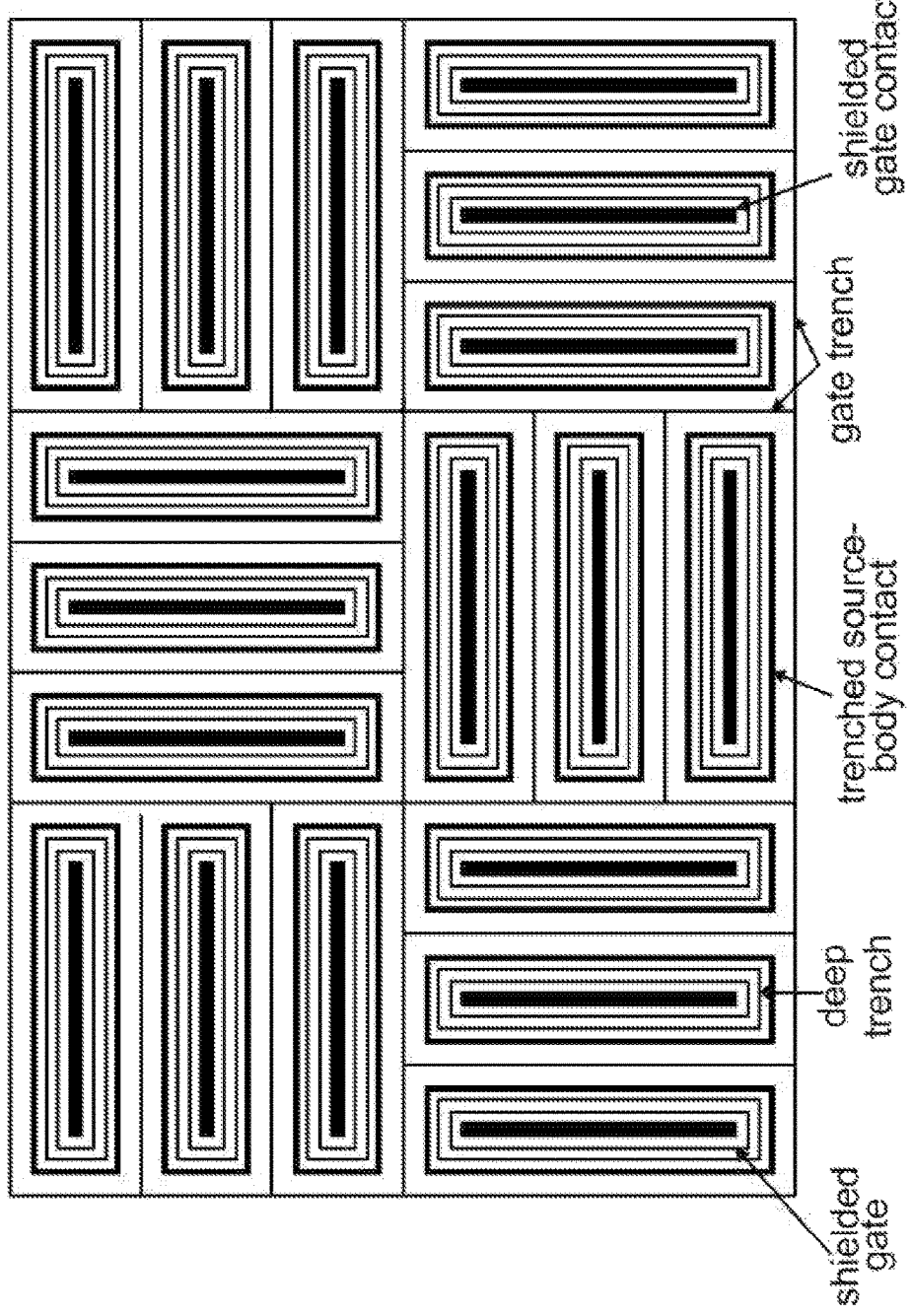
FIG. 7 is a top view of another preferred embodiment according to the present invention.
Figure 8:
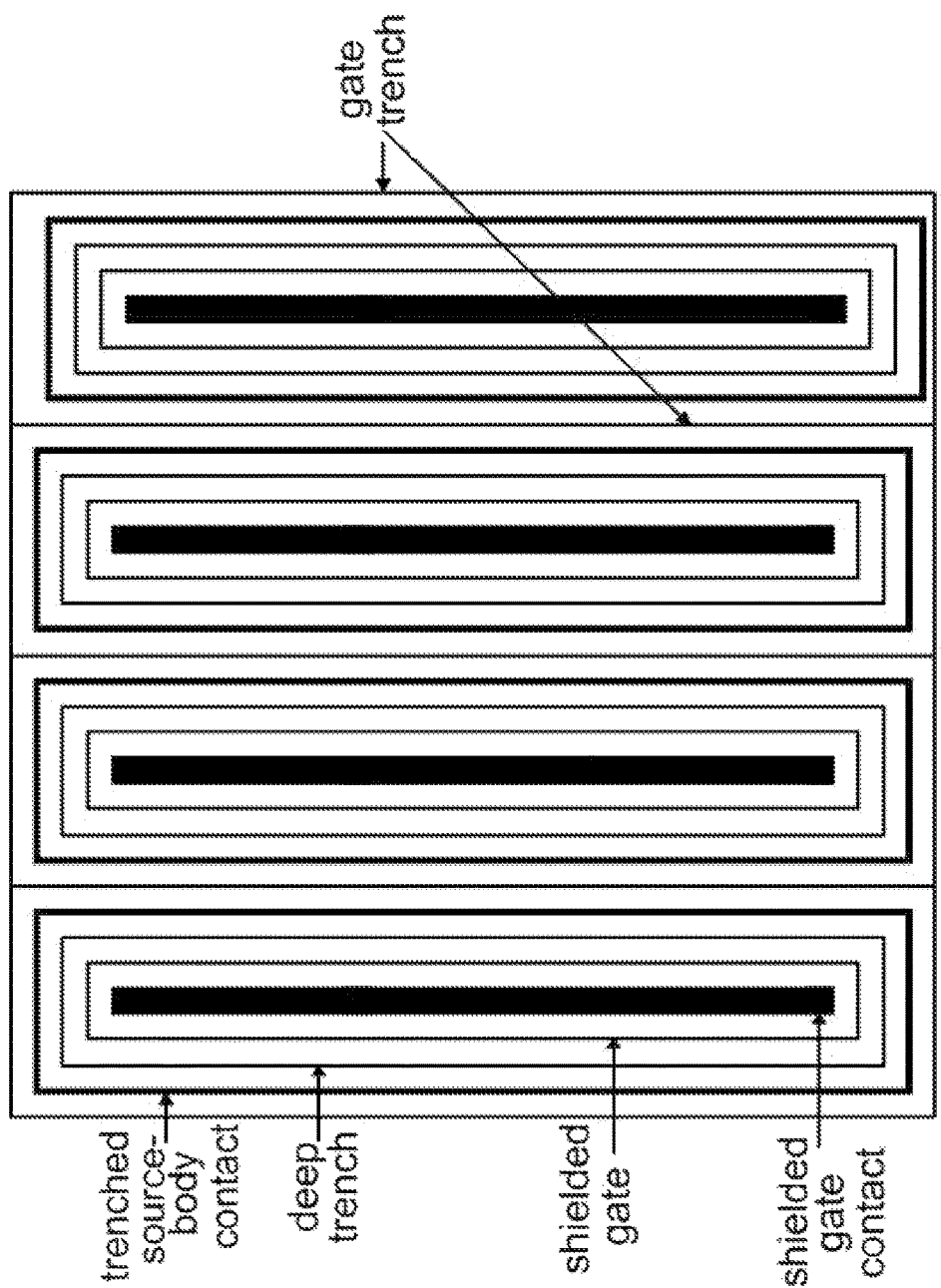
FIG. 8 is a top view of another preferred embodiment according to the present invention.

FIG. 5 shows top view of the preferred embodiment according to the present invention with square closed cell layout. In which the preferred cross-sectional views are shown in FIG. 2-4. FIGS. 6-8 show another preferred top views according to the present invention. FIG. 6 shows a preferred top view with rectangular closed cell layer, in which all said rectangular closed cells are arranged in single orientation. FIG. 7 shows a preferred top view with rectangular closed cell layer, in which all said rectangular closed cells are arranged in multiple orientations. FIG. 8 shows a preferred top view with stripe cell.

Figure 9:
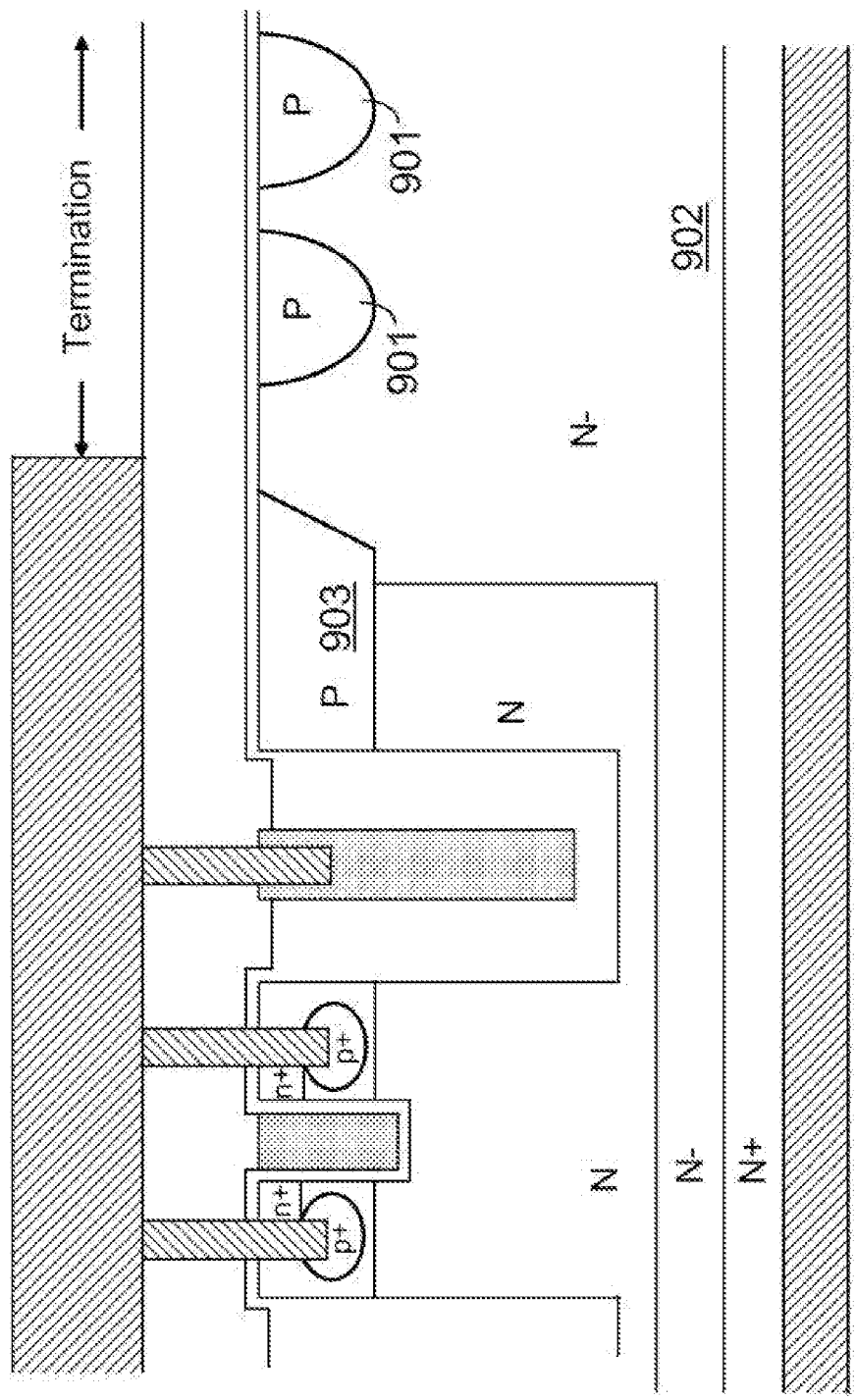
FIG. 9 is a cross-sectional view of another preferred embodiment according to the present invention.

FIG. 9 is a cross-sectional view of another preferred embodiment according to the present invention. Compared to the trench MOSFET 200 in FIG. 2, the trench MOSFET in FIG. 9 further comprises a termination area which further comprises multiple P well floating rings 901 being spaced apart by N-epitaxial layer 902. Meanwhile, said P well floating rings 901 all have junction depth same as the P body region 903.

Figure 10:
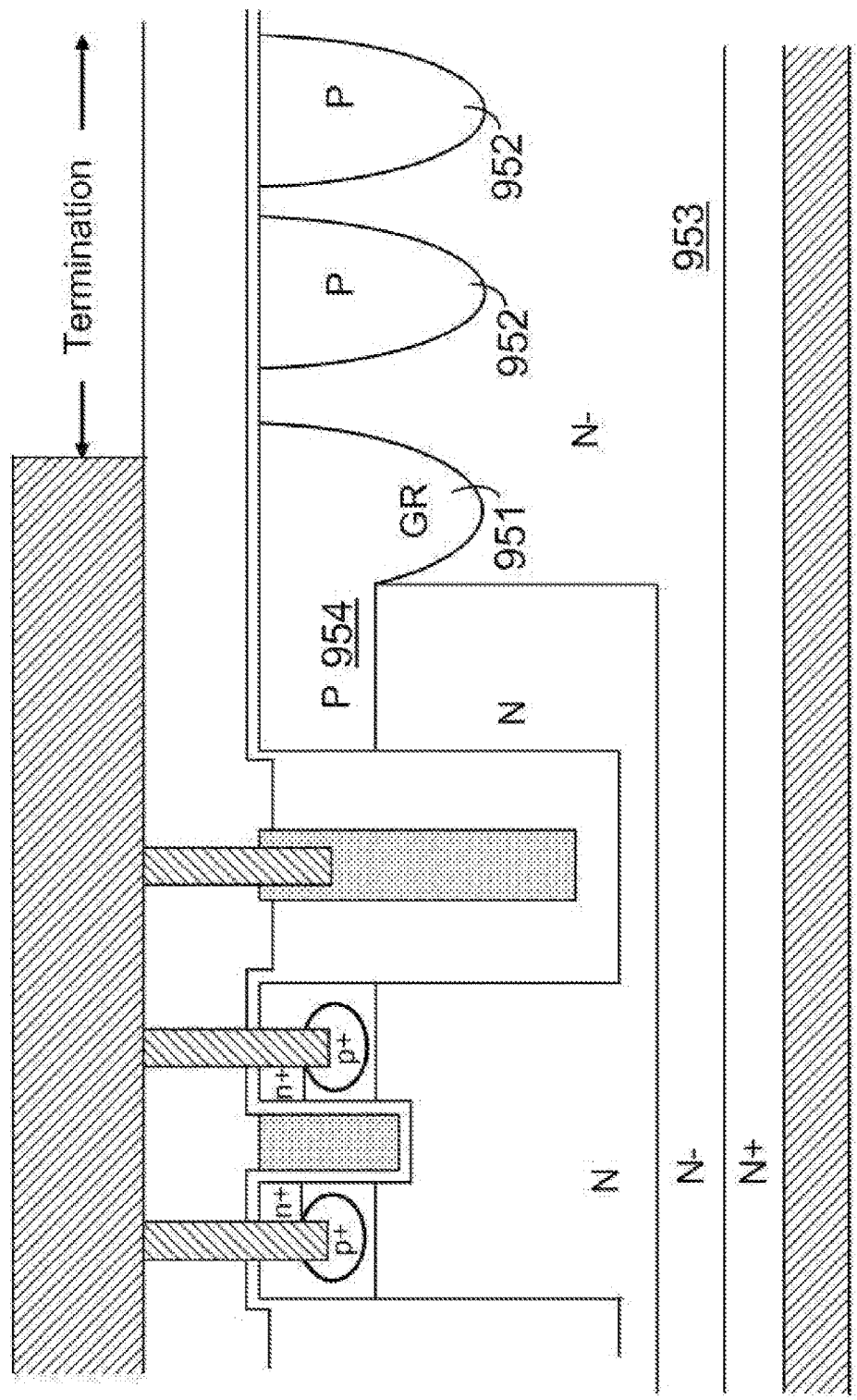
FIG. 10 is a cross-sectional view of another preferred embodiment according to the present invention.

FIG. 10 is a cross-sectional view of another preferred embodiment according to the present invention. Compared to the trench MOSFET 200 in FIG. 2, the trench MOSFET in FIG. 10 further comprises a termination area which further comprises a P type guard ring 951 (GR, as illustrated in FIG. 10) and multiple P type floating guard rings 952, wherein said P type guard ring 951 and said P type floating guard rings 952 are being spaced apart by N-epitaxial layer 953 and all having junction depth greater than the P body region 954.

Figure 11A:
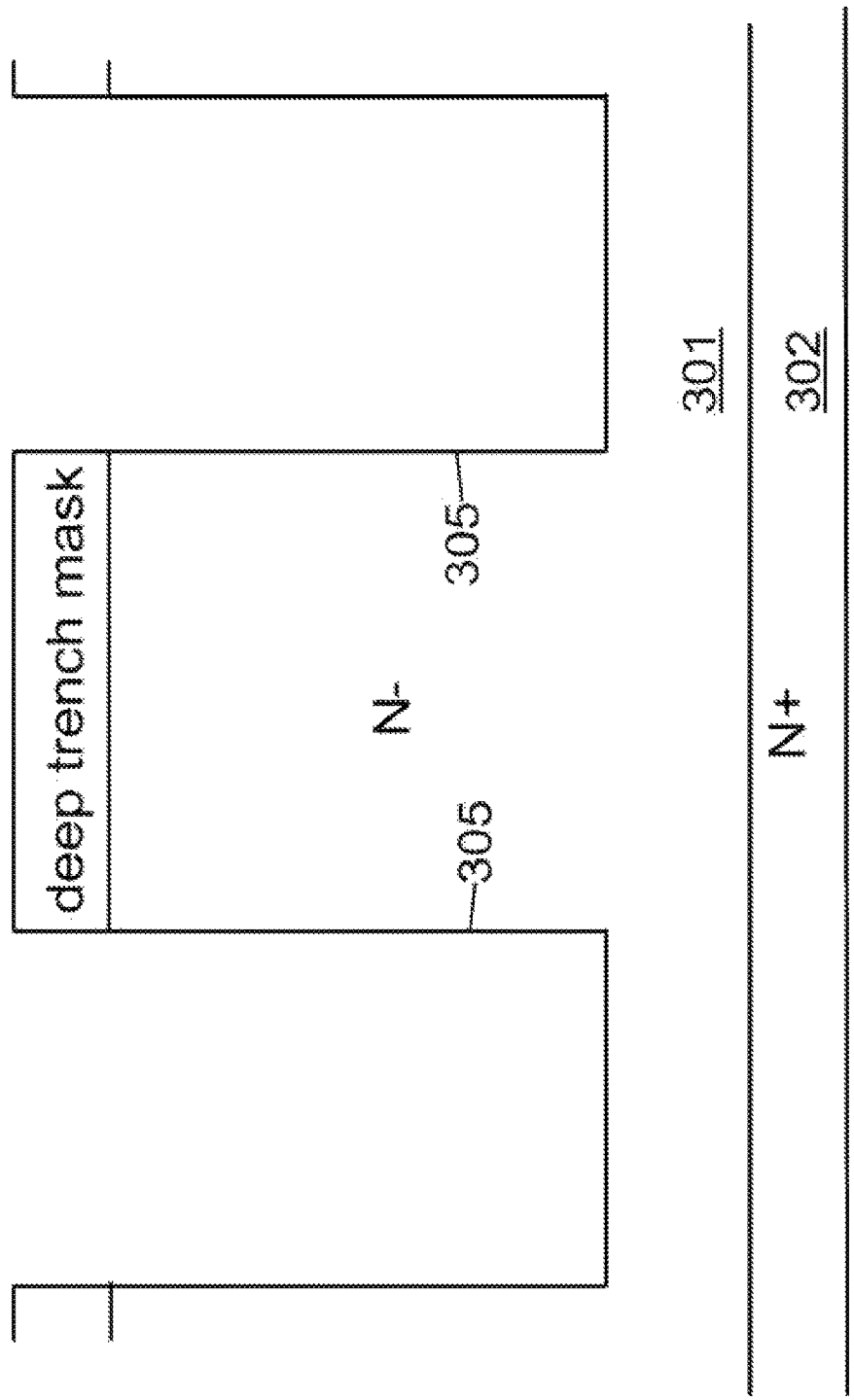

FIGS. 11A~11O are a serial of exemplary steps that are performed to form the invention trench MOSFET 300 of FIG. 3. In FIG. 11A, an N-epitaxial layer 301 is grown on an N+ substrate 302. Next, a deep trench mask (e.g., oxide layer) is formed onto a top surface of said N-epitaxial layer 301 for definition of areas for deep trenches 305. Then, after dry oxide etch and dry silicon etch, a pair of deep trenches 305 are etched penetrating through open regions in the hard mask, and extending into said N-epitaxial layer 301.

Figure 11B:
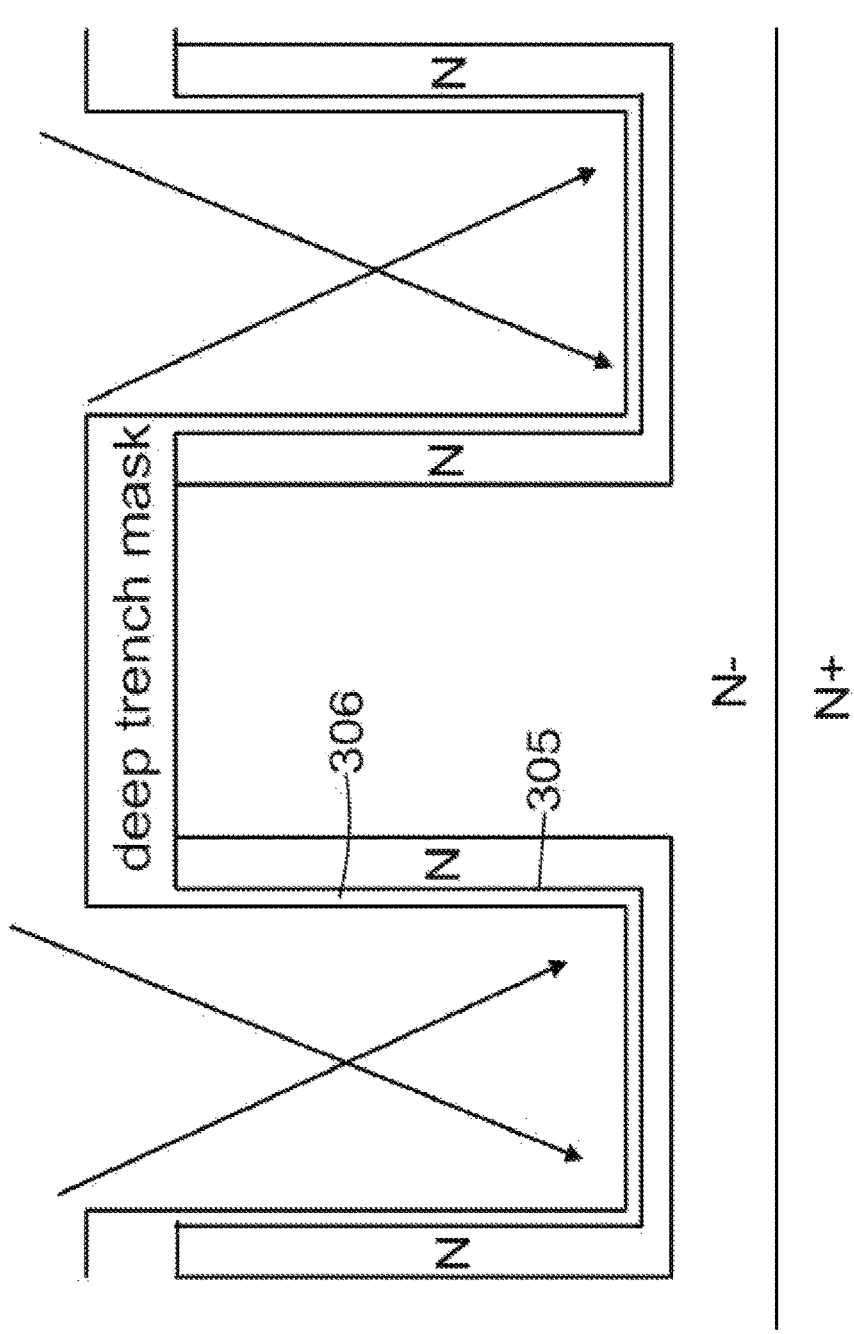

In FIG. 11B, a screen oxide 306 is grown along inner surface of said deep trenches 305. Then, a step of angle Ion Implantation of Arsenic or Phosphorus dopant is carried out into the mesa area through open regions in the deep trench mask and sidewalls of said deep trenches 305.

Figure 11C:
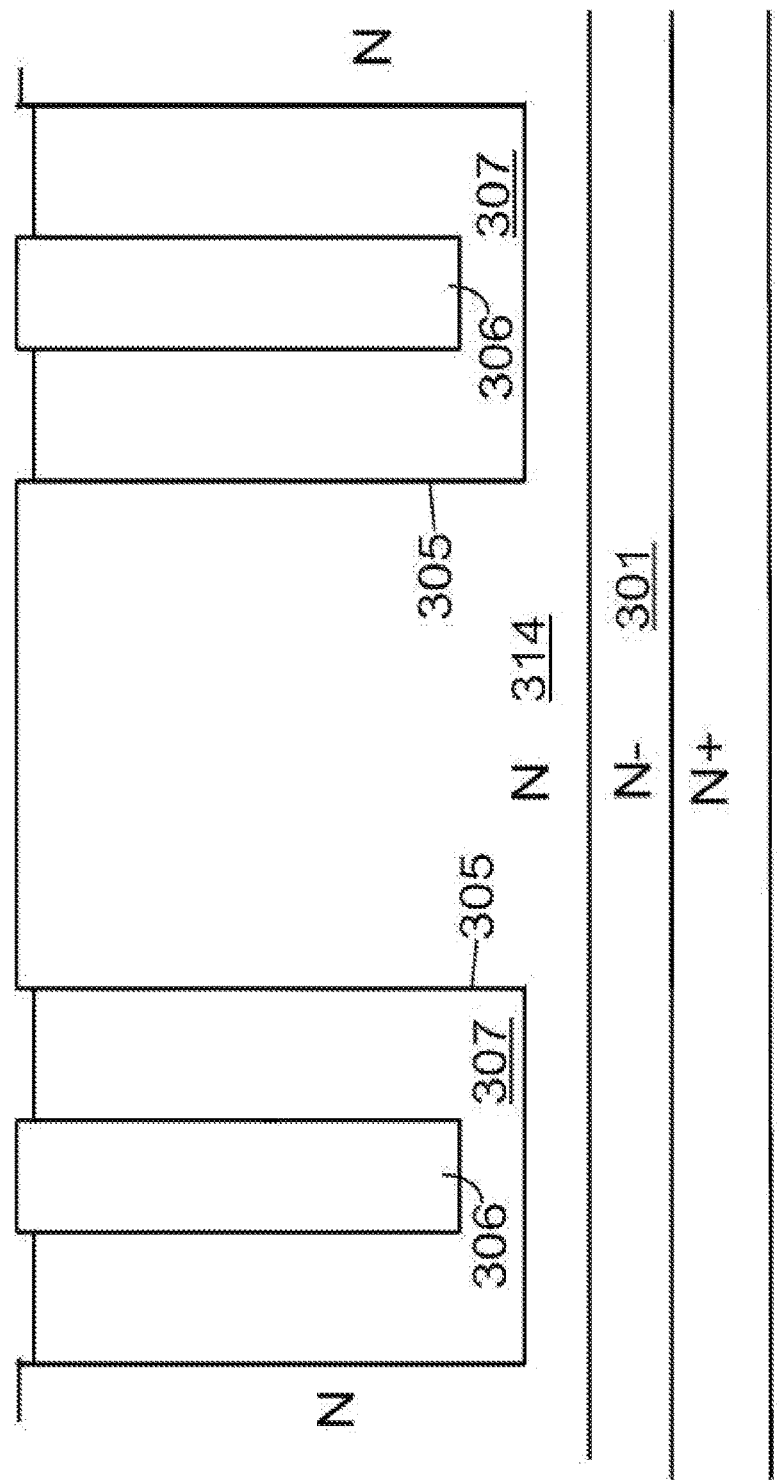

In FIG. 11C, a diffusion step is first carried out to form an N diffused drift region in the mesa area between a pair of said deep trenches 305 above said N-epitaxial layer 301. Meanwhile, the trench bottom of said deep trenches 305 is therefore above the common interface between said N diffused drift region 314 and said N-epitaxial layer 301. Then, in order to form an dielectric material 307 inside said deep trenches 305, a step of thermal oxide grown and/or a step of thick oxide deposition can be chosen to used. Next, a first doped poly deposition and etch back are successively performed to form the shielded gate electrode 308 inside each of said deep trench 305. After that, a step of oxide etch back is carried out to remove unnecessary part of oxide above the top surface of said N-epitaxial layer 301.

Figure 11D:
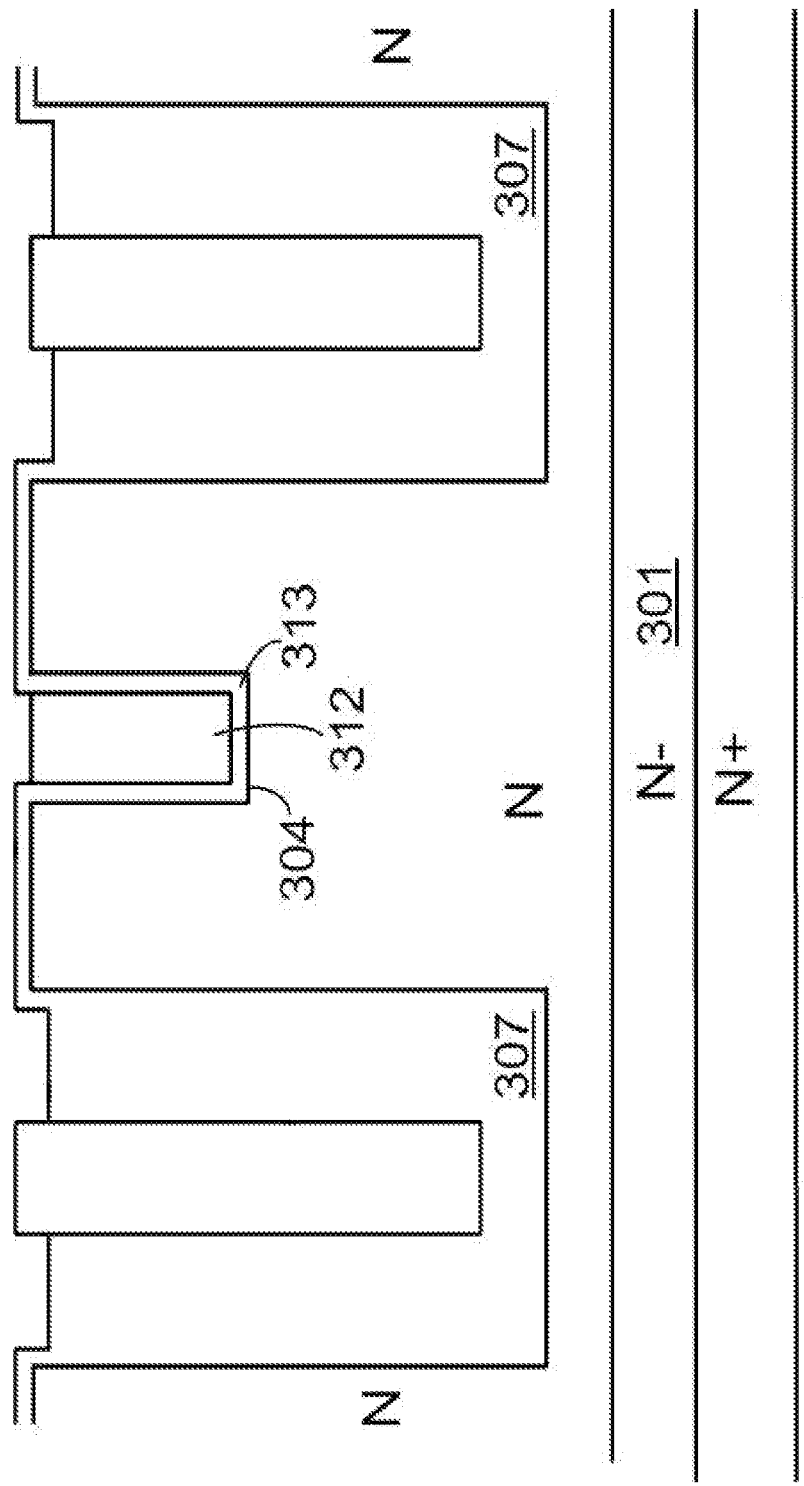

FIG. 11D, by applying a gate trench mask (not shown), a gate trench 304 is formed by dry silicon etch. Then, a oxide layer is grown along inner surface of said gate trench 304 and top surface of said N-epitaxial layer 301 to serve as gate oxide layer 313 which has a thinner thickness than said dielectric material 307. After that, a second doped poly deposition and etch back or CMP are successively performed to form the gate electrode 312.

In FIG. 11E, a body implantation of P type dopant is carried out over entire top surface and followed by a diffusion step to form a P body region 311 surrounding sidewalls of said gate trench 304. Then, by apply a source mask, a source implantation of N type dopant is carried out and followed by a diffusion step to form n+ source regions 310 above said P body region 311.

Figure 11F:
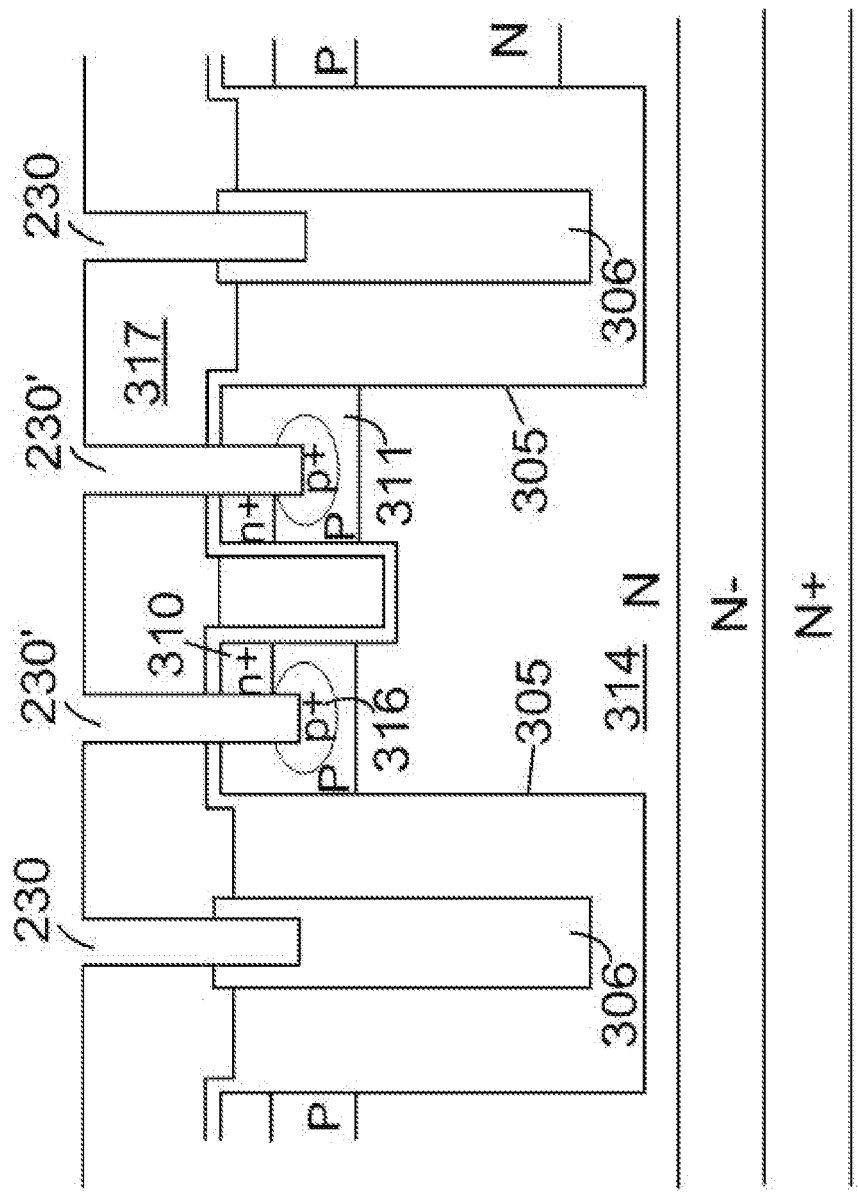

In FIG. 11F, another oxide layer is deposited onto top surface of the structure to serve as a contact interlayer 317. Then, after applying a contact mask (not shown), a plurality of openings 230 and 230' are formed by dry oxide etch and dry silicon etch, wherein said openings 230 are penetrating through said contact interlayer 317 and extending into said shielded gate electrode, said openings 230' are penetrating through said contact interlayer 317, said n+ source region 310 and extending into said P body region 311. Then, a BF2 ion implantation and diffusion step is successively carried out to form a p+ ohmin-contact region 216 surrounding each bottom and said openings 230' in said P body region 311.

Figure 11G:
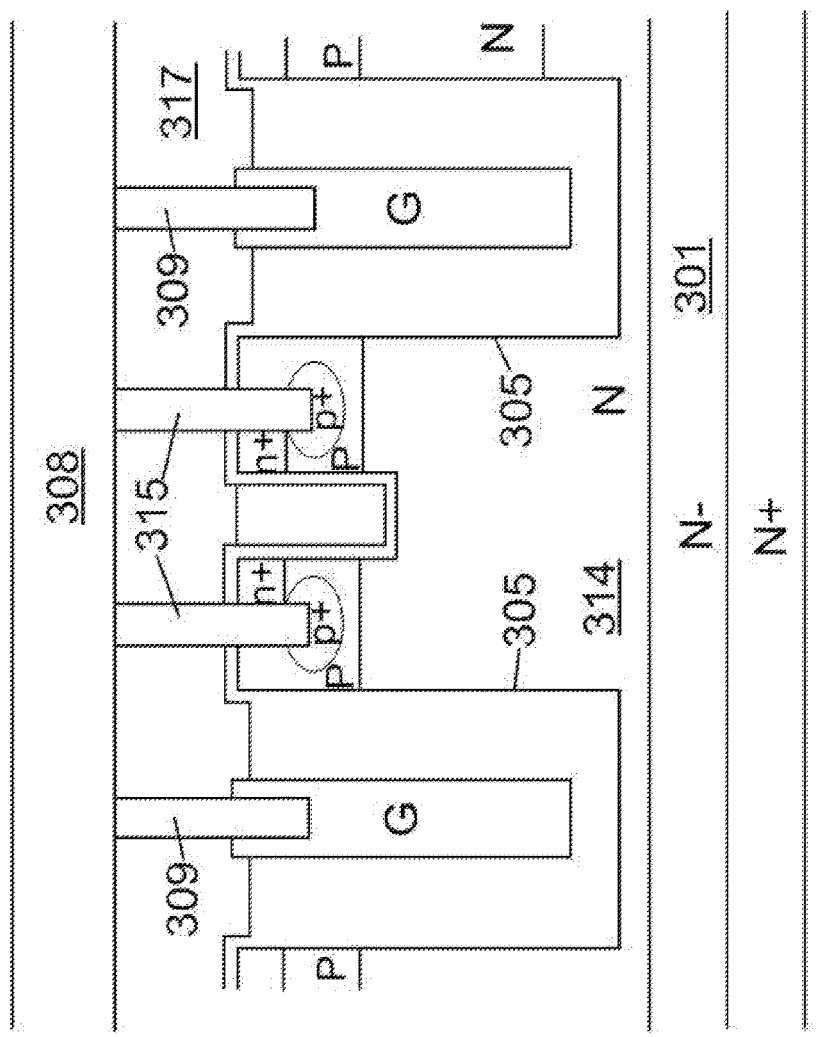

In FIG. 11G, a barrier layer of Ti/TiN or Co/TiN or Ta/TiN is first deposited on sidewalls and bottoms of all said openings 230 and 230' in FIG. 11F. Then, a tungsten material layer is deposited on said barrier layer, after which said tungsten material layer and said barrier layer are etched back to from: shielded gate contacts 309 and trenched source-body contacts 315. Then, a metal of Al alloys or Cu padded by a resistance-reduction layer Ti or Ti/TiN underneath is deposited onto said contact interlayer 317, and followed by a metal etching process by employing a metal mask (not shown) to be patterned as a front source metal 308.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is:

1. A trench MOSFET comprising a plurality of unit cells with each unit cell in an active area comprising:
    at least one gate trench surrounding a deep trench as a closed cell shape, wherein said deep trench comprising a shielded gate formed inside;
    a trenched source-body contact disposed between said gate trench and said deep trench; and
    a substrate of a first conductivity type;
    an epitaxial layer of said first conductivity type onto said substrate, wherein said epitaxial layer has a lower doping concentration than said substrate;
    said deep trench having a greater trench depth than said gate trench;
    said shielded gate being formed within said deep trench and surrounded with a dielectric material;
    a mesa area between a pair of adjacent deep trenches;
    a diffused drift region of said first conductivity type formed in said mesa area and having a higher doping concentration than said epitaxial layer, wherein said diffused drift region has a higher doping concentration near trench sidewalls of said deep trench than in the center of said mesa area;
    a source region of said first conductivity type extending between said deep trenches and surrounding sidewalls of said gate trench above a body region of a second conductivity type;
    said gate trench filled with gate electrode padded by a gate insulation layer, starting from top surface of said epitaxial layer and down penetrating through said source region, said body region and extending into said diffused drift region in said mesa area, wherein said gate insulation layer has a thickness thinner than said dielectric material; and a source metal connected with the shielded gate through a shielded gate contact and connected with the source region through the trenched source-body contact.

2. The trench MOSFET of claim 1 wherein said trenched source-body contact each filled with a contact metal plug extending into said body region in said mesa.

3. The trench MOSFET of claim 2, wherein said contact metal plug is a tungsten plug padded by a barrier metal layer of Ti/TiN or Co/TiN or Ta/TiN.

4. The trench MOSFET of claim 1 wherein said gate trench has a square shape.

5. The trench MOSFET of claim 1 wherein said gate trench has a rectangular shape and arranged in single orientation.

6. The trench MOSFET of claim 1 wherein said gate trench has a rectangular shape and arranged in multiple orientation.

7. The trench MOSFET of claim 1 wherein said gate trench has a circle shape.

8. The trench MOSFET of claim 1 wherein said gate trench has a hexagon shape.

9. The trench MOSFET of claim 1 further comprising a body contact region of said second conductivity type in said body region and surrounding at least bottom of said trenched source-body contact, wherein said body contact region has a higher doping concentration than said body region.

10. The trench MOSFET of claim 1 further comprising a termination area which comprises a guard ring connected with said body region, and multiple floating guard rings having floating voltage, wherein said guard ring and said multiple floating guard rings of said second conductivity type have junction depths greater than said body region.

11. The trench MOSFET of claim 1 further comprising a termination area which comprises multiple floating rings of said second conductivity type and having floating voltage, wherein said multiple floating rings of said second conductivity type have junction depths same as the body region.

12. The trench MOSFET of claim 1 wherein said deep trench has bottom above common interface between said diffused drift region and said epitaxial layer.

13. The trench MOSFET of claim 1 wherein said deep trench is penetrating through the diffused drift region and extending to said epitaxial layer.

14. The trench MOSFET of claim 1 wherein said deep trench is penetrating through said diffused drift region and extending to said substrate.

15. A method for manufacturing a trench MOSFET of claim 1 comprising the steps of:

growing an epitaxial layer of a first conductivity type upon a substrate of the first conductivity type, wherein the epitaxial layer having a lower doping concentration than the substrate;

forming a deep trench mask such as an oxide onto a top surface of said epitaxial layer for definition of a plurality of deep trenches;

forming said gate trenches, and a mesa between two adjacent gate trenches in said epitaxial layer by etching through open regions in the deep trench mask;

growing a screen oxide along inner surface of said gate trenches;

carrying out an angle Ion Implantation of said first conductivity type dopant into said mesa through trench sidewalls of said deep trenches followed by a diffusion step to form a diffused drift region in said mesa;

removing the hard mask after formation of said diffused drift regions;

forming a dielectric material along inner surfaces of said gate trenches by thermal oxide growth or oxide deposition;

depositing a first doped poly-silicon layer filling said deep trenches to serve as shielded gate;

etching back said first doped poly-silicon and the padded oxide layer from unnecessary portion;

etching a gate trench in said mesa between two adjacent deep trenches by applying a trench mask;

forming a thin oxide layer to serve as a gate insulation layer covering a top surface of said epitaxial layer, along inner surface of said gate trench;

depositing a second doped poly-silicon layer filling said gate trench to serve as a gate electrode;

etching back said second doped poly-silicon layer by CMP (Chemical Mechanical Polishing) or plasma etch;

carrying out a body implantation of the second conductivity type dopant and a step of body diffusion to form body regions;

applying a source mask onto the top surface of the epitaxial layer, and carrying out a source implantation of said first conductivity type dopant and a source diffusion to form source regions;

forming a contact insulating interlayer covering top surface of said epitaxial layer; and etching opening and fillings contact metal plug in those openings to form shielded gate contacts and trenched source-body contacts.

16. The method of claim 15, after forming said source regions, further comprising:

carrying out BF2 ion implantation to form a body contact regions of said second conductivity type in said body region and surrounding at least bottom of each said trenched source-body contacts, said body contact region having a heavier doping concentration than said body region.

17. The method of claim 16, after forming said body contact doped regions, further comprising:

depositing a tungsten metal layer padded by a barrier metal layer in said trenched source-body contacts and said shielded gate contacts.

* * * * *